United States Patent [19]
Liebel et al.

[11] Patent Number: 5,046,106
[45] Date of Patent: Sep. 3, 1991

[54] VARYING LOUDSPEAKER SPATIAL CHARACTERISTICS IN A VEHICLE

[75] Inventors: Craig Liebel, Framingham; Richard McFadyen, Worcester, both of Mass.

[73] Assignee: Bose Corporation, Framingham, Mass.

[21] Appl. No.: 466,994

[22] Filed: Jan. 18, 1990

[51] Int. Cl.⁵ .............................................. H03G 9/00
[52] U.S. Cl. ..................................... 381/102; 381/86
[58] Field of Search ................... 381/86, 105, 1, 109, 381/28, 102

[56] References Cited

U.S. PATENT DOCUMENTS

| | | | |
|---|---|---|---|
| 4,292,467 | 9/1981 | Odlen et al. | 381/1 |
| 4,528,686 | 7/1985 | Dressler | 381/105 |
| 4,736,426 | 4/1988 | Kinoshita et al. | 381/1 |
| 4,845,775 | 7/1989 | Kanagawa | 381/105 |

*Primary Examiner*—Forester W. Isen
*Attorney, Agent, or Firm*—Fish & Richardson

[57] ABSTRACT

A shifting control is operative in a first region for varying the treble and midrange components of a sound signal as variously applied to the speakers of a multi-speaker system while the bass component remains unchanged, and is operative in a second region wherein all frequency components can be substantially attenuated.

15 Claims, 7 Drawing Sheets

FADER

VARYING LOUDSPEAKER SPATIAL CHARACTERISTICS IN A VEHICLE

BACKGROUND OF THE INVENTION

The present invention relates to varying spatial characteristics of a loudspeaker system.

A typical vehicle sound system has a fader control for varying the relative intensity of sound radiated by front and rear loudspeakers. Preferably the fader control effects relative intensity without substantial change in total sound intensity of the system. More particularly, if the fader is at an end position, then either the front or rear speakers will receive maximum and the other minimum sound energy. However, since the fader control affects spectral components of the sound energy, typically above 250-300 Hz, and negligibly affects the bass components, then all of the system loudspeakers receive substantially the same energy below 250-300 Hz.

SUMMARY OF THE INVENTION

The invention includes a fader control which is operative in a first intermediate region for varying the relative intensity of treble/midrange spectral components of a sound signal between front and rear speakers of a multi-speaker system while the bass components remain substantially unchanged, and is operative in at least one end region wherein all frequency components are substantially attenuated. Other features and advantages will become apparent from the following detailed description when read in connection with the accompanying drawings in which.

Figure 1:
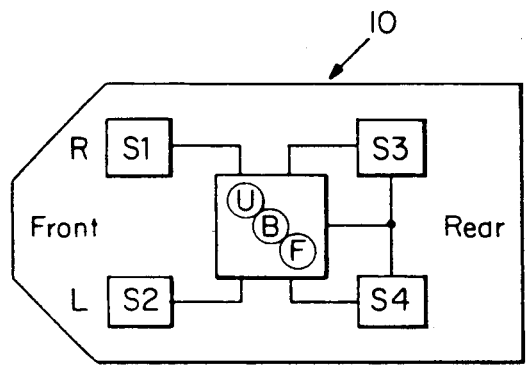
FIG. 1 is a block diagram of an automotive audio system.

Referring to FIG. 1, an automotive stereo system 10 is shown including front deck loudspeakers S1, S2 and rear deck speakers S3, S4. The speakers are coupled to and driven by an audio unit 12 having volume "V", balance "B", and fader "F" controls.

The volume control preferably incorporates a feature including dynamic equalization such as disclosed in U.S. Pat. No. 4,490,843, and at least the fader control embodies principles of U.S. Pat. No. 4,218,583 whereby the bass components of the audio signal remain essentially unchanged as applied to all speakers in the system, but the relative intensity of treble/midrange components of the audio signal applied to the front and rear sets of speakers varies according to adjustment of the fader control. This permits shifting of the perceived image without affecting relative loudness. As a result, for any given volume setting, with the fader at an end setting so as to apply the treble/midrange frequency components predominantly to the front speakers, for example, the listener perceives the sound coming from the front while all speakers S1-S4 still receive equal intensities of the bass component, unaffected by the fader control. Passengers in the rear still perceive some sound coming from the rear; for example, a listener may be able to physically sense the source of bass. This sound may be disturbing to rear passengers desiring to converse or sleep. The present invention overcomes this disadvantage in a manner which achieves the high fidelity and pleasing characteristics of a state-of-the-art stereo system.

Figure 2:
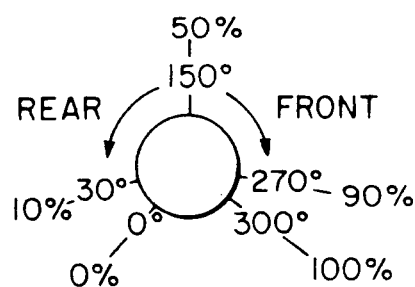
FIG. 2 is a plan view of a balance control.

In accordance with the foregoing, the fader control, and perhaps also the balance control, of a stereo system can be provided, such as the fader shown in FIG. 2, having one hundred percent of its rotation distributed over 300 degrees of travel. Between roughly 10% (30°) and 90% (270°), the fader control of FIG. 2 acts essentially as in the manner described for a shifting control in U.S. Pat. No. 4,218,583. Therefore, at 90% (270°), the treble/midrange components are essentially entirely directed to the front speakers only, in this example. However, minimal attenuation has been made of the bass component applied to all four speakers. Now as the fader control advances from 90% (270°) to 100% (300°), for example, all frequency components are essentially fully attenuated so as to effectively quiet rear speakers S3, S4 while front speakers S1, S2 receive the full intensity of treble/midrange and bass components. In a like manner, positioning the fader at 10% (30°) applies the treble/midrange signals essentially to the rear speakers only, with full bass components distributed among all four speakers. Retarding the fader now to the 0% (0°) position effectively removes all frequency components from the front speakers so as to effectively quiet them from the system while the rear speakers receive the full components, thereby enabling front passengers to converse and rear passengers to enjoy the program material.

Figure 3:
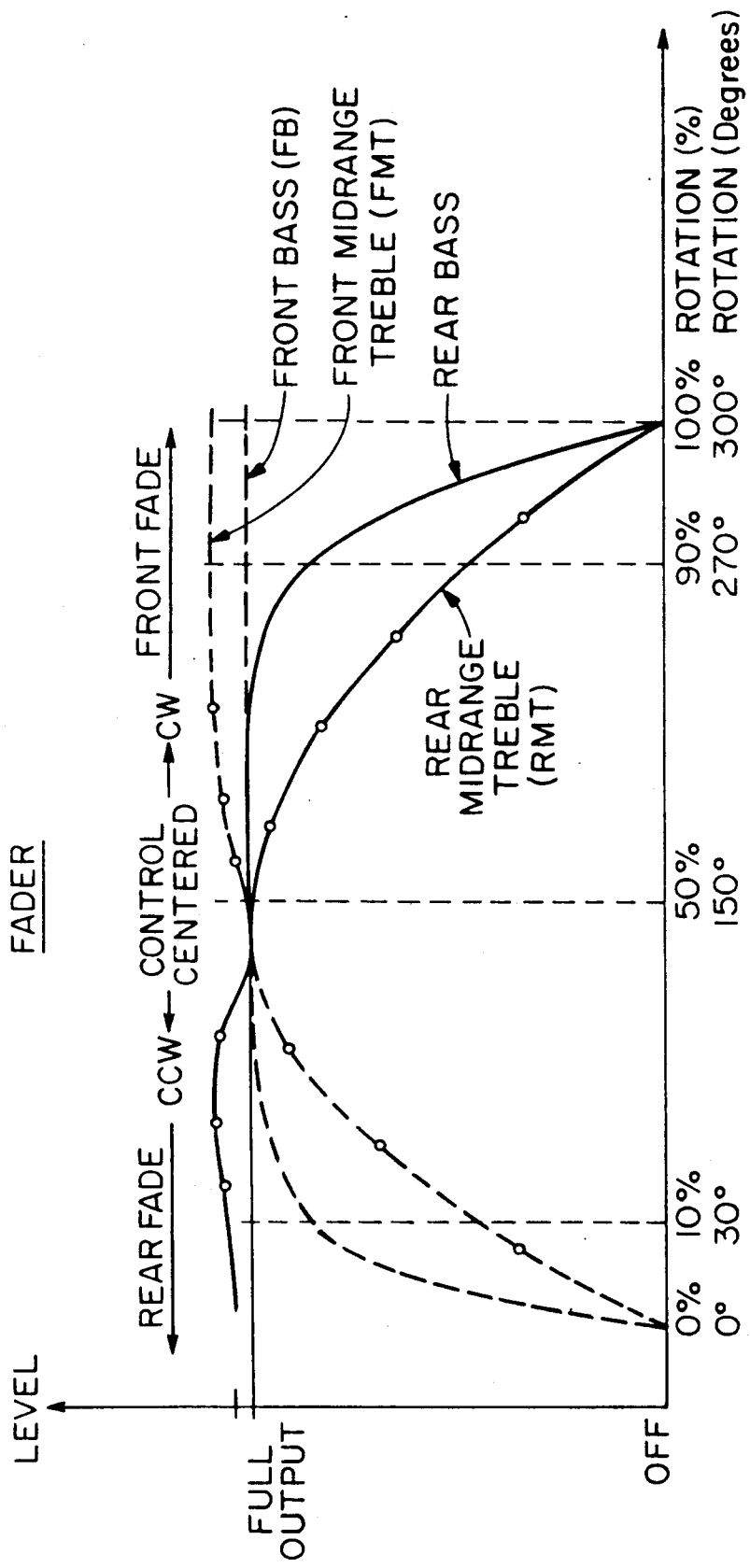
FIG. 3 is a graph of the response characteristics of a fader control of the present invention.

The preferred response characteristics of the fader control of FIG. 2 with respect to signals supplied to the front and rear speakers is shown in FIG. 3. The curves represent the front bass signal components (FB), the front treble/midrange signal components (FMT), the rear bass signal components (RB) and the rear treble/midrange signal components (RMT) as a function of fader setting. At 90% of full front (270°) the bass component applied to the rear speakers rolls off down to about 75% of full, but is not attenuated on the front speakers; meanwhile the rear treble/midrange has been attenuated to approximately 40%. Upon further advance of the control wiper arm from 90% and 100% (i.e., from 270° to 300°), both the rear treble/midrange and bass components are attenuated down to substantially zero.

It will now be appreciated that a fader circuit can be implemented to provide in a vehicle (or any other environment) the benefits of the invention disclosed in U.S. Pat. No. 4,218,583, but with the enhanced ability of essentially fully attenuating in a pleasing manner the output of either the front or rear sets of speakers when desired.

Figure 4:
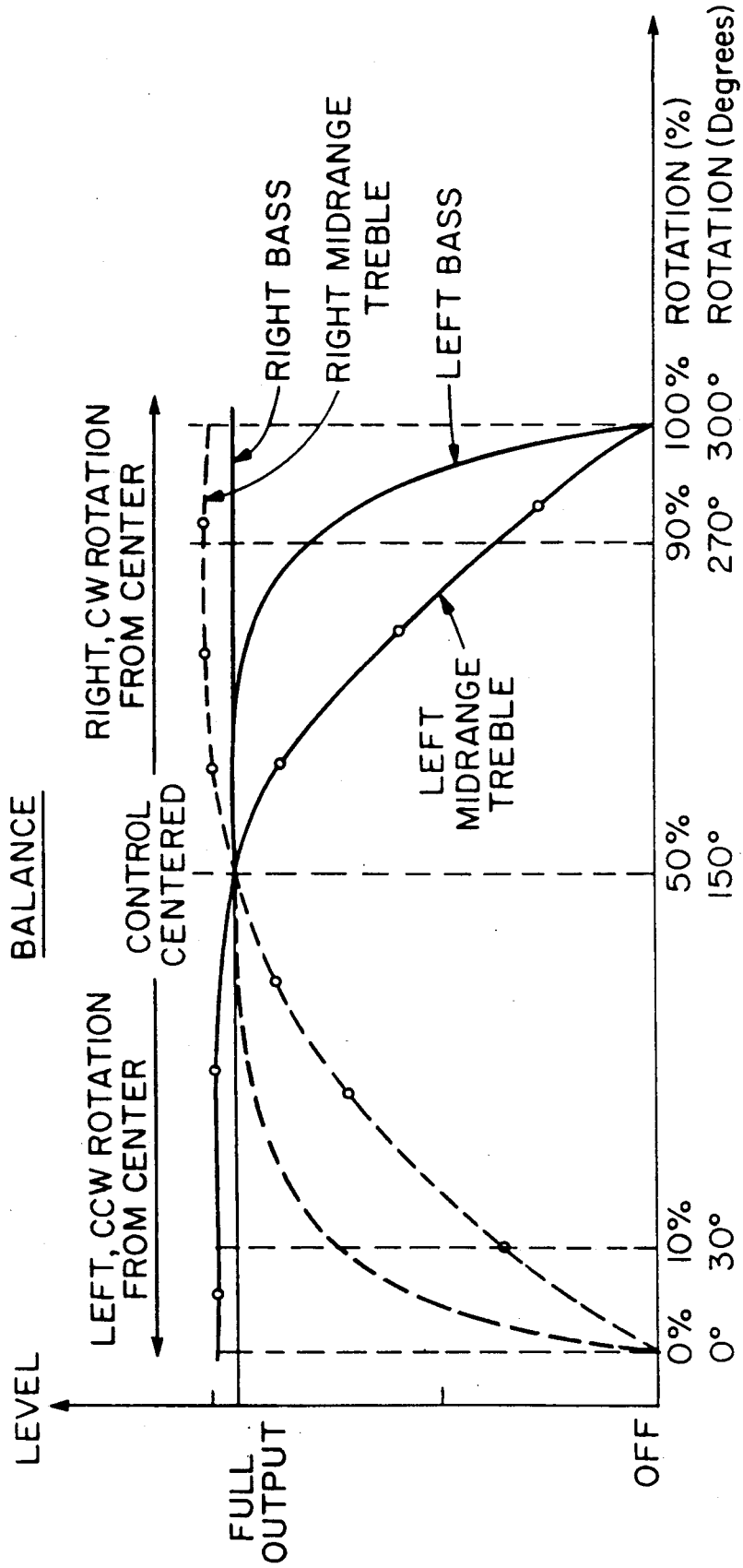
FIG. 4 is a graph of the response characteristics of a balance control of the present invention.

Furthermore, a balance control may be provided so as to effect the balance between left hand (S1, S3) and right hand (S2, S4) sets of speakers of the system, while maintaining the front-rear features described above. The balance control operates in a manner analogous to that of the fader control described above. Referring to FIG. 4, there is shown a graph of left-right response as a function of balance control setting. With the balance control rotated to the 10% position (30°), the left hand treble/midrange and bass components are essentially unattenuated. However, the right hand bass component is at approximately 75% of maximum and the right hand treble/midrange components are at approximately 40% of maximum. As the balance control is further retarded to the full left end, the right bass and treble/midrange components are reduced to zero volume, while the left bass and treble/midrange components remain unattenuated.

Figure 5:
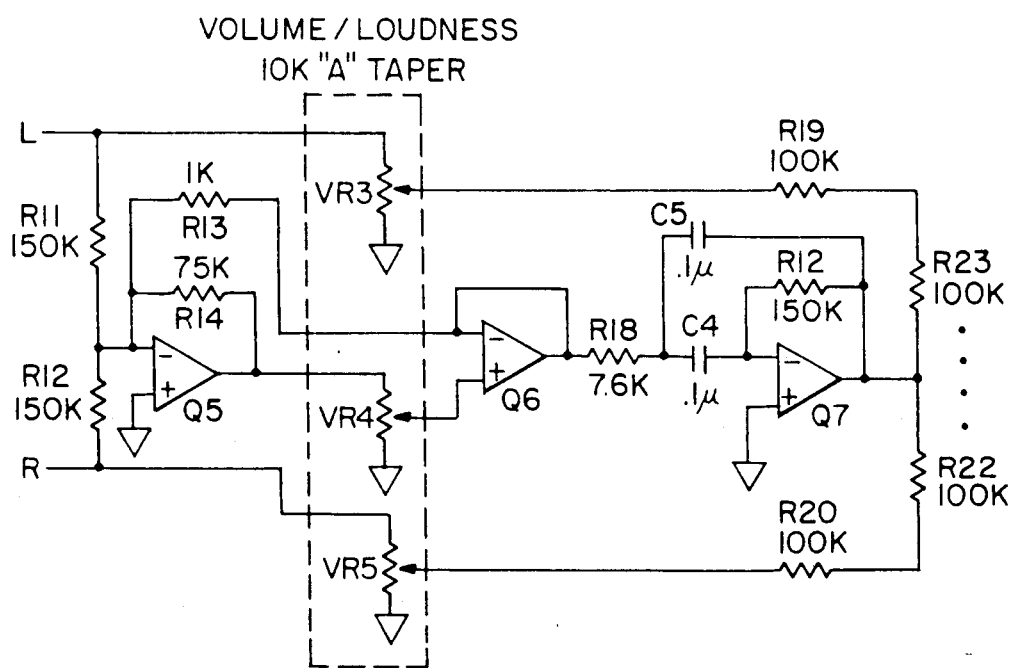
FIG. 5 is a schematic diagram of a volume/dynamic equalization control of the present invention.
Figure 6:
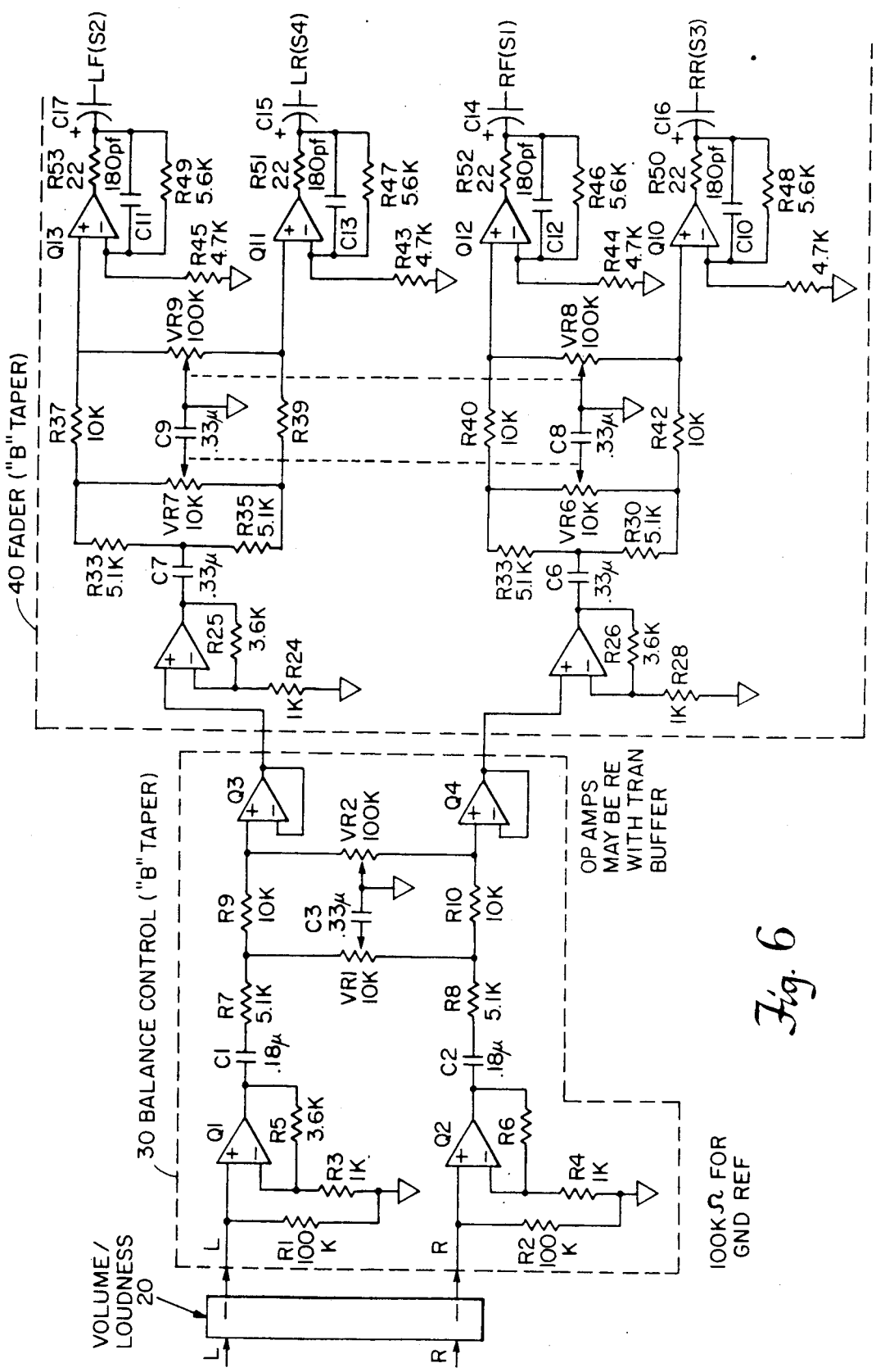
FIG. 6 is a schematic diagram of a balance control and a fader control of the present invention.

Referring now to FIGS. 5 and 6, an exemplary embodiment of the present invention is shown where an audio unit 12 includes a volume/dynamic equalization control 20, a balance control 30 and a fader control 40. Each of these controls is independent and can be considered and utilized separately; they are here combined into one system both for their individual and combined benefits.

For each of the following descriptions, only the left channel circuit will be described in cases where the left and right channels are identical, except as otherwise noted or required for better description of the invention. The preferred values of the components are as shown in the figures, although other values may be employed in accordance with the teachings of the present invention.

As shown in FIG. 5, a preferred volume/dynamic equalization circuit 20 has two variable resistors VR3, VR5 as part of the volume circuits for the left and right channels, respectively, and variable resistor VR4, with associated hardware, acting as a dynamic equalization circuit. The three variable resistors, VR3, VR4, VR5, are ganged together. The system audio signals are applied to the left and right channels in a conventional manner. The volume of the left and right channel is controlled by adjustment of the variable resistor VR3, VR5 wiper arms, the latter being coupled to the ultimate output of the dynamic equalization circuit at the junction of resistors R19, R23 and R20, R22, respectively.

Resistors R11, R12 apply a portion of the left, right channel inputs to the inverting input of amplifier Q5 and to amplifier Q6 via resistor R13. The output of amplifier Q5 is fed back to its input in an amplifying configuration, with the non-inverting input tied to ground. The inverted output of amplifier Q5 is applied to one leg of variable resistor VR4, with the other leg tied to ground; the wiper arm is connected to the non-inverting input of amplifier Q6.

The output of amplifier Q6, is fed back to its inverting input and also is applied via resistor R18 and capacitor C4 to the inverting input of amplifier Q7. The non-inverting input is tied to ground. The output of amplifier Q7 is coupled back via resistor R12 (whose value controls amplifier gain) to the amplifier's non-inverting input. Capacitor C5 is coupled between the amplifier output and the junction of capacitor C4 and resistor R18 as a tuning capacitor. Resistor R18, capacitor C4, C5 comprise an active resonant circuit to drive amplifier Q7.

This circuit acts as a band-pass filter/amplifier in a variable voltage divider network. The filter is narrow band, having a Q of 2, and a 25 Hz band width at $f_c=30$ Hz. The slope desirably extends effectively to about 150 Hz. At the resonant frequency, the desired narrow band signal is supplied by the amplifier via resistors R23, R22 to be summed with the left and right channel signals after resistors R19, R20, respectively. When the volume control is set high, a negligible signal will pass across the higher resistance path of resistors R11, R12 compared to the signal in the lower resistance path through variable resistors VR3, VR5 and resistors R19, R20, respectively; but when the volume is set low, then the dynamic equalization feature proportionately (and automatically) takes effect to add a band-limited signal component to the left, right channels.

The channel signal output from volume/dynamic equalization control 20 includes treble midrange and bass signal components for each channel. As shown in FIG. 6, the left channel signal components are collectively applied to the non-inverting input of amplifier Q1 of balance control 30 circuit. This input is tied by resistor R1 to ground reference. The output of the amplifier is fed back to its inverting input via resistor R5, the latter input being referenced to ground via resistor R3. This signal is coupled serially via capacitor C1 and resistor R7 to the junction of resistor R9 and a first leg of variable resistor VR1. The wiper arm of VR1 is coupled via capacitor C3 to ground. The other end of resistor R9 is coupled to one end of variable resistor VR2 and to the non-inverting input of amplifier Q3. With the output of amplifier Q3 tied to its inverting input, the amplifier acts essentially as a non-inverting buffer. The wiper arm of variable resistor VR2 is tied to ground. Hence, capacitor C3, in conjunction with resistors R7 and VR1, is selected so that the 3 db roll-off of the balance control is at about 90 Hz. Capacitor C1 acts to compensate the midrange response to be essentially flat.

Thus the balance control circuit 30 essentially acts as a low-pass filter up to this point, with the treble/midrange component being shunted to ground through resistor VR1 and capacitor C3 according to the position of the wiper arm of resistor VR1. The bass component is not then attenuated and now appears at the junction of resistor R9 and one end of variable resistor VR2. The bass component is attenuated according to the position of the wiper arm of variable resistor VR2 (tied to ground), with the unattenuated treble/midrange and bass signal components then being applied to the non-inverting input of buffer amplifier Q3.

Variable resistors VR1 and VR2 are preferably ganged together. In order to achieve the completely off feature of the present invention (i.e., between zero and 10% and 90 and 100% of the balance control wiper arm position), along with the substantially constant volume feature of the present invention (i.e., at least from 10% to 90%), the tapers of variable resistors VR1 and VR2 are preferably suitably coordinated. A configuration which achieves the responses shown in FIG. 4 is preferred.

The output of the balance control circuit 30 is applied to fader circuit 40, where the left channel portion includes variable resistors VR7, VR9 tied together in the same manner as the balance control variable resistors VR1, VR2. However, variable resistors VR7, VR9 are further ganged together with variable resistors VR6, VR8 of the right channel portion of the fader. In this manner, the front and the rear speaker pairs may be faded according to their respective pairings. The fader corner frequency is preferably at about 250 Hz.

Again, referring only to the left hand channel, the output of balance control 30 is applied to the non-inverting input of amplifier Q9 of fader circuit 40. The amplifier output is tied via resistor R25 to the amplifier's inverting input, which is tied to ground reference via resistor R24. The amplified output of amplifier Q9 is coupled to a resistive divider of resistors R31, R33 via capacitor C7.

The left channel signal is coupled respectively by resistors R31, R33 to both ends of variable resistor VR7, and to a first end of respective resistors R37, R39. The wiper arm of variable resistor VR7 is tied to ground via capacitor C9. The other end of resistors R37, R39 are respectively tied both to the non-inverting input of respective amplifier Q13, Q11 and to variable resistor VR9 at respective ends thereof. The wiper arm of variable resistor VR9 is tied to ground. This section of the fader operates analogously to the low pass arrangement of the variable resistors VR1, VR2 of the balance control. Hence, high frequency components can be shunted to ground via the wiper arm of variable resistor VR7 and capacitor C9 while the low frequency components are passed via resistors R37, R39 to variable resistor VR9. The bass component is attenuated via the VR9 wiper arm coupled to ground according to the wiper arm position. The unattenuated treble/midrange and bass components are then coupled to a respective non-inverting input of amplifier/capacitative coupler/buffer Q13, Q11, the output of which is passed via resistor R53, R51 to capacitor C17, C15, respectively, for coupling to respective speakers S2, S4.

Figure 7:
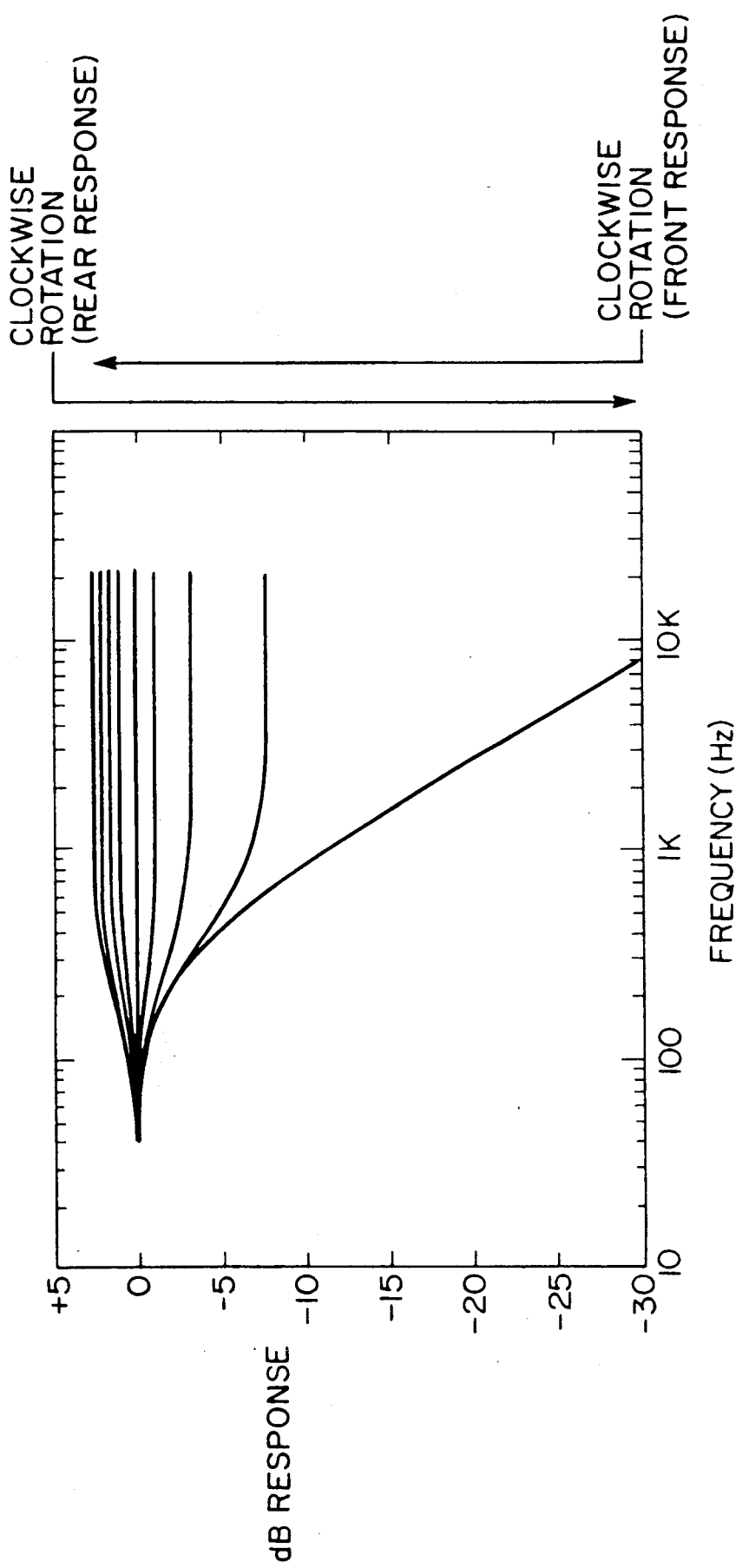
FIGS. 7 and 8 are, respectively, a graph of the response of a fader control without and with, respectively, the present invention.
Figure 8:
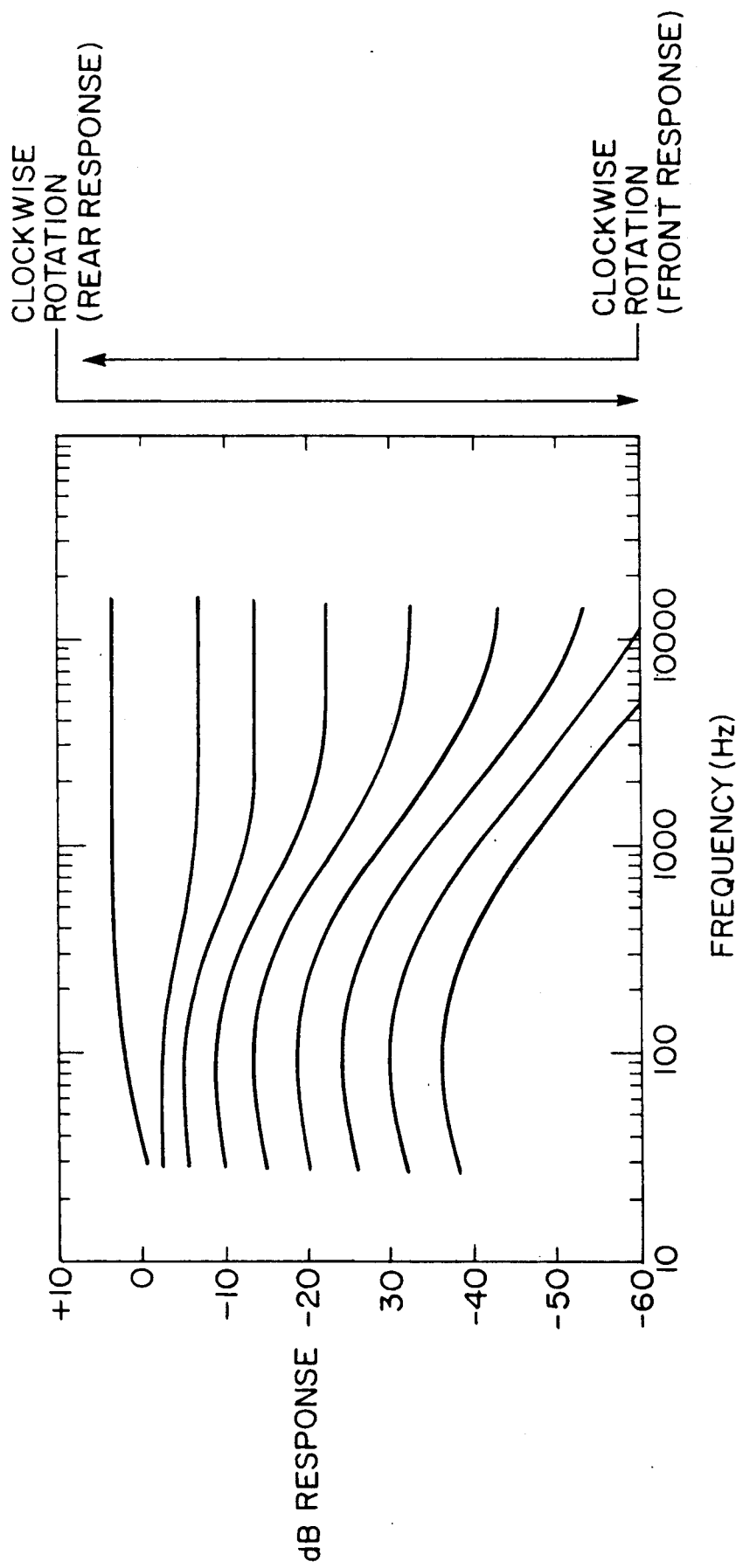

An exemplary plot of the response characteristics of a spatial fader control circuit having a level control for treble/midrange only is shown in FIG. 7. An exemplary plot of the response characteristics of a fader control circuit incorporating the present invention with level control for treble/midrange and bass is shown in FIG. 8.

Figure 9:
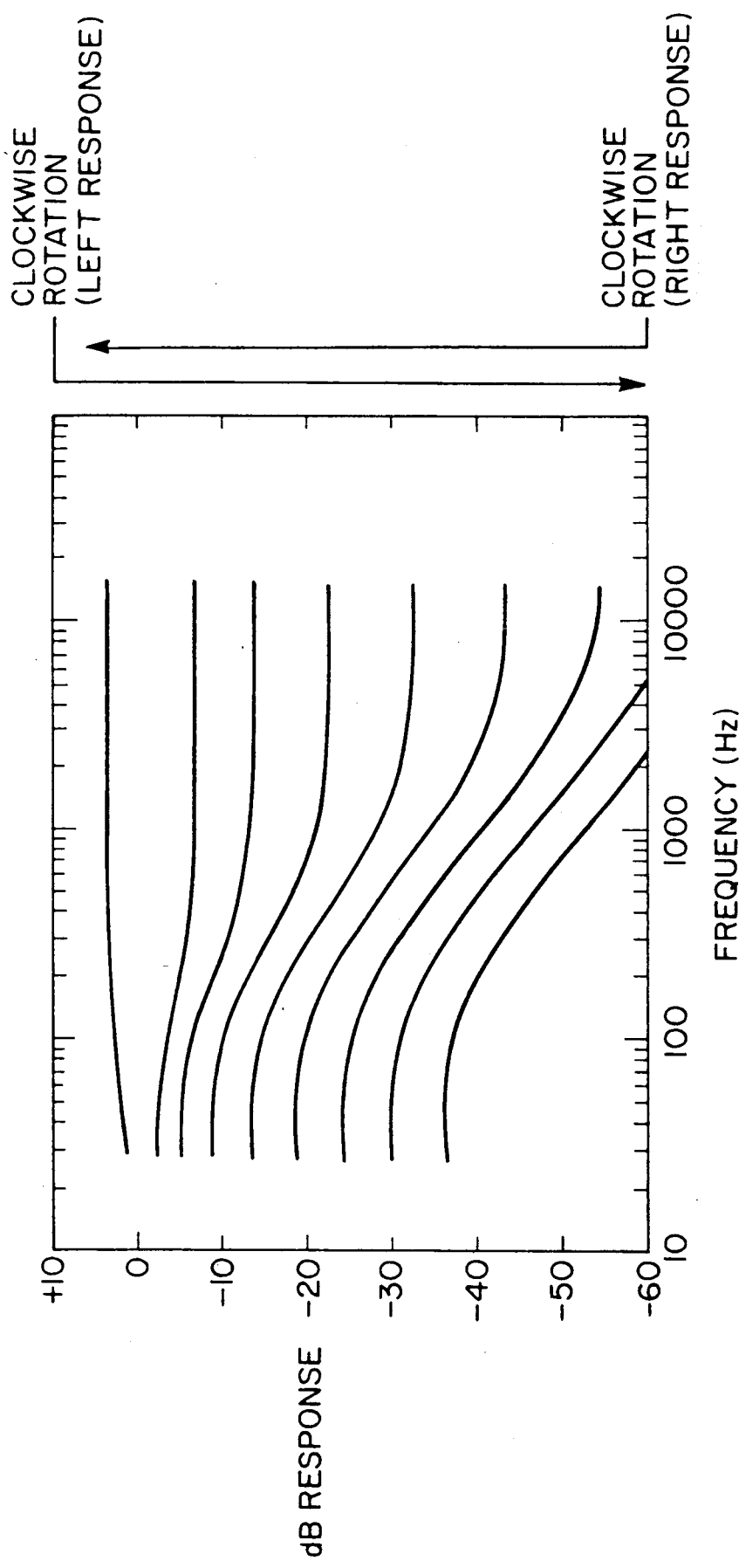
FIG. 9 is a graph of the response of a balance control incorporating the present invention.

FIG. 9 is an exemplary plot of the response characteristics of a balance control circuit in conjunction with the present invention.

Other embodiments are within the following claims.
What is claimed is:

1. In a multi-loudspeaker audio system for use with a plurality of loudspeakers formable in pairs where an audio unit supplies an audio signal having treble, midrange and bass components to an adjustable control network, the network being capable of varying the intensity of the treble and midrange components as it is applied from the audio unit to any loudspeaker or pair of loudspeakers in the system while the bass component remains essentially unchanged so as to effectively change the perceived origin of the sound energy radiated by the system, the control network being adjustable via a shifting control device having an adjustable range embracing an intermediate range separating two end ranges, the improvement comprising wherein the shifting control device is characterized by two operative range, the first range being said intermediate range and providing variable attenuation only of the treble and midrange components supplied to the shifting control device and the second range being said end ranges providing for substantially complete attenuation of all components supplied to the shifting control device so that in the first range the bass component received by each loudspeaker remains essentially unchanged while in the second range at least one loudspeaker receives no treble, midrange or bass components.

2. The system of claim 1 wherein the first range encompasses approximately between 10% and 90% of the adjustable range of the shifting control device and the second range is approximately outside the 10% to 90% range.

3. The system of claim 2 wherein essentially the same signal level is applied to respective speakers when the shifting control device is set at midrange of the first range.

4. The system of claim 1 wherein the shifting control device includes a fader control circuit couplable between two pairs of the loudspeakers.

5. The system of claim 1 wherein the shifting control device includes a balance control couplable between two pairs of the loudspeakers.

6. The system of claim 1 wherein the audio unit includes a volume/dynamic equalization control which is couplable between two pairs of loudspeakers.

7. The apparatus of claim 6 wherein the volume/dynamic equalization control includes means for boosting spectral components of the audio signal at bass frequencies relative to the amplitude of spectral components at treble and midrange frequencies as a function of manually controlled gain imparted to the audio signal, below the frequency of approximately 200 Hz.

8. The system of claim 2 wherein the shifting control device includes a fader control circuit couplable between two of the loudspeakers or two pairs of the loudspeakers and which circuit attenuates the treble and midrange components applied to one of the loudspeakers or one pair of the loudspeakers by approximately 60% when the fader control is substantially at 10% or 90% of its maximum adjustable range.

9. The system of claim 8 wherein the treble, midrange and bass components applied to one pair of the loudspeakers are substantially reduced to zero as the fader control circuit is set to an extreme of the second range.

10. The system of claim 3 wherein the shifting control device includes a balance control circuit couplable between two pairs of the loudspeakers and which circuit attenuates the treble and midrange components applied to one of the pairs of loudspeakers by approximately 60% when the balance control is at a 10% or 90% of its maximum adjustable range, without equally attenuating the bass component.

11. The system of claim 10 wherein the treble, midrange and bass components applied to one pair of the loudspeakers are substantially reduced when the balance control circuit is set to an extreme of the second range.

12. An apparatus, cooperable with a plurality of loudspeakers which includes both a first set and a second set of speakers, each set having at least a first and a second speaker, for controlling the perceived image of a sound signal including treble, midrange and bass components radiated by a speaker or speakers of the sets of speakers, comprising
a signal control device for controlling the volume of the sound signal,
a shifting control device for controlling the amount of sound signal delivered to the first and/or second set,
a second shifting control device for controlling the balance between first and second speakers within the first and/or second set,
at least one of the shifting control devices including a controller having plural ranges within a single overall range for adjusting within a first of the plural ranges the amount of treble and midrange components of the sound signal to be delivered to a selected speaker or speakers of the sets of speakers without substantially attenuating the bass component, and for substantially attenuating the treble, midrange and bass components of the sound signal to be delivered to the selected speaker or speakers within a second of the plural ranges of the at least one shifting control device, whereby perceived origin of the sound energy radiated by any of the speakers can be effectively controlled within the first range and all of the sound energy possibly radiated by a selected speaker or speakers of the sets of speakers can be substantially attenuated within the second range.

13. The apparatus of claim 12 wherein the volume control device includes means for boosting spectral components of the sound signal at bass frequencies relative to the amplitude of spectral components at treble and midrange frequencies as a function of manually controlled gain imparted to the sound signal, below the frequency of approximately 200 Hz.

14. The apparatus of claim 12 including an automobile having a front deck and rear deck, a first pair of the speakers being mounted in the rear deck and a second pair being mounted in the front deck, whereby the perceived image of the sound signal can be controlled between the speakers and the signal applied to any of the speakers can effectively be reduced to zero.

15. The apparatus of claim 14 wherein the frong deck is located in or adjacent to the front end or front sides of the automobile and the rear deck is located in or adjacent to the rear and or rear sides of the automobile.

* * * * *